United States Patent [19]

Mamodaly et al.

[11] Patent Number: 4,754,236
[45] Date of Patent: Jun. 28, 1988

[54] FREQUENCY-DOUBLING VOLTAGE-CONTROLLED OSCILLATOR

[75] Inventors: Narguise Mamodaly; Didier Kaminsky, both of Paris, France

[73] Assignee: Thomson-CSF, Paris, France

[21] Appl. No.: 38,647

[22] Filed: Apr. 15, 1987

[30] Foreign Application Priority Data

Apr. 18, 1986 [FR] France ................. 86 05651

[51] Int. Cl.$^4$ ............................................. H03B 5/00
[52] U.S. Cl. .......................... 331/117 FE; 331/177 V
[58] Field of Search ......... 331/108 C, 117 FE, 117 R, 331/167, 177 V; 455/318

[56] References Cited

U.S. PATENT DOCUMENTS 4,677,691 6/1987 Scott ............................. 331/117 FE

FOREIGN PATENT DOCUMENTS 0017899 10/1980 European Pat. Off. .
0085241 10/1983 European Pat. Off. .
1303540 1/1972 Fed. Rep. of Germany .

OTHER PUBLICATIONS

New Electronics, vol. 15, No. 24, Dec. 1982, p. 19, Harpenden, Herts, GB; I. Mar.: "A Wide Range V.C.O".
1980 IEEE International Solid-State Circuits Conference, Feb. 1980, pp. 118, 119, New York, U. S. R. Van Tuyl: "A Monolithic GaAs FET RF Signal Generation Chip", p. 118, Colonne de Gauche.

Primary Examiner—Eugene R. Laroche
Assistant Examiner—Robert J. Pascal
Attorney, Agent, or Firm—Oblon, Fisher, Spivak, McClelland & Maier

[57] ABSTRACT

A frequency-doubling voltage-controlled oscillator (VCO) for use in the microwave frequency range has two channels which operate in parallel. A transistor is mounted as an oscillating system in each channel and its energy is collected on the drain electrode. The two transistors are mounted with their output currents in opposite phase, thus reducing FM noise in the vicinity of the carrier. In accordance with the invention, phase opposition is obtained by means of a varactor connected between the gates of the two transistors. The varactor is decoupled in direct current by means of two capacitors. In order to increase the range of frequencies, two additional varactors can be mounted in like manner on the source circuits of the two transistors.

6 Claims, 1 Drawing Sheet

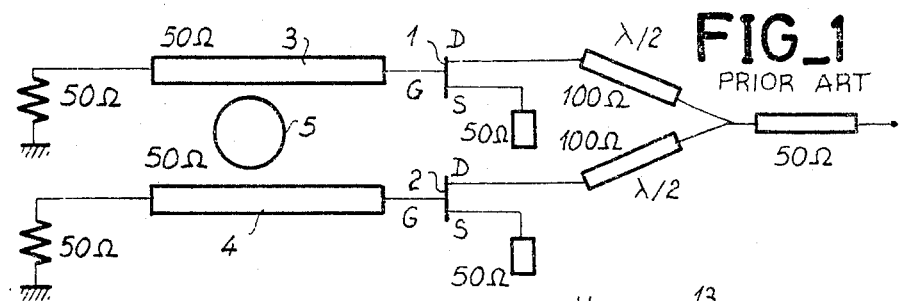
FIG_1 PRIOR ART
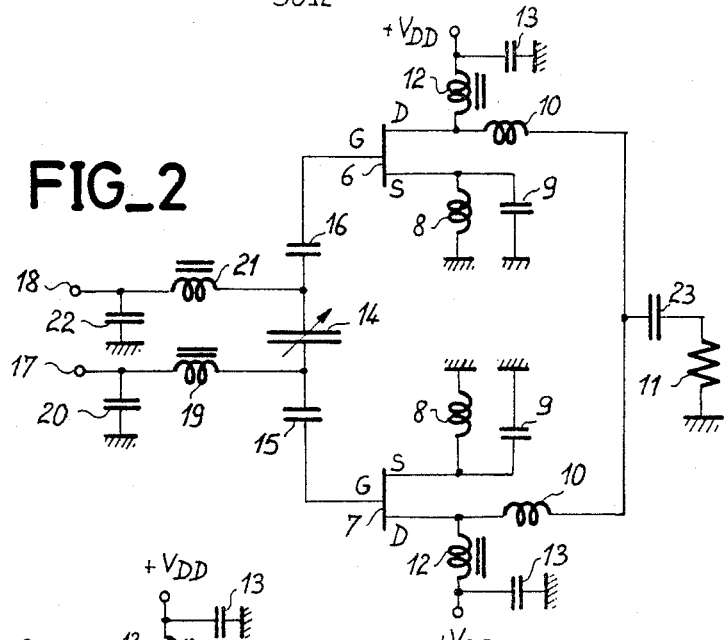
FIG_2
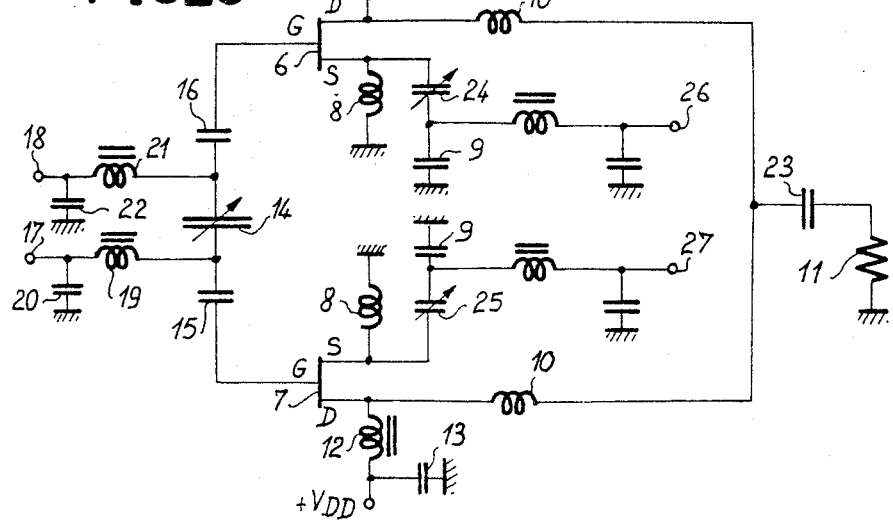
FIG_3

FREQUENCY-DOUBLING VOLTAGE-CONTROLLED OSCILLATOR

BACKGROUND OF THE INVENTION

1. Field of the Invention

The present invention relates to a microwave electronic circuit and more specifically to a frequency-doubling voltage-controlled oscillator (VCO) having low frequency-modulation noise in the vicinity of the center frequency or so-called carrier frequency of the oscillator.

2. Description of the Prior Art

By definition, a voltage-controlled oscillator (VCO) makes it necessary to provide a resonant circuit which permits oscillation over a very wide range of frequencies corresponding to a flat curve of frequency as a function of voltage whereas an oscillator for a pure frequency has a very sharp curve with minimized frequency modulation (FM) noise in the vicinity of the carrier.

In point of fact, one of the shortcomings of VCOs is their excessive FM noise in the vicinity of the carrier. For example in the case of field-effect-transistor oscillators having a substantial bandwidth (1 octave), an FM noise level of $-65$ to $-80$ dBc/Hz at 100 kHz on each side of a 5-GHz carrier is a common value.

In order to reduce the FM noise in the vicinity of the carrier, it is a known practice to construct a VCO in the form of a frequency-doubling or so-called doubler oscillator in which two transistors are mounted in parallel and operate under conditions such that their drain currents are in phase opposition in the fundamental mode.

SUMMARY OF THE INVENTION

In accordance with the invention, the two transistors are mounted in opposite phase at their outputs by making use of a varactor or variable-capacitance diode, each access terminal of which is connected to a gate of a field-effect transistor or to the base of this latter if the doubler VCO is composed of bipolar transistors. The varactor is therefore mounted as a bridge between the two gates of the two transistors.

The term varactor is understood to designate a device of the junction diode type in which the reactance may be modified by a bias voltage in a controlled manner.

In more precise terms, the invention relates to a frequency-doubling voltage-controlled oscillator having two transistors operating in parallel in which the currents collected on one of the access electrodes (source or drain) of said transistors are in phase opposition with a view to reducing frequency-modulation noise in the vicinity of the fundamental frequency of the oscillator. The distinctive feature of said oscillator lies in the fact that it has a single circuit for the two gates of the two transistors, said single circuit being constituted by a varactor, each access terminal of which is connected to one transistor gate.

BRIEF DESCRIPTION OF THE DRAWINGS

FIG. 1 is a simplified diagram of a frequency-doubler oscillator in accordance with the prior art.

FIG. 2 is an electrical diagram of a doubler oscillator in accordance with the invention.

FIG. 3 is an electrical diagram showing an alternative circuit arrangement of the doubler oscillator in accordance with the invention.

DESCRIPTION OF THE PREFERRED EMBODIMENTS

Doubler oscillators are known devices in which two transistors usually consisting of microwave field-effect transistors are associated and operate in parallel. In these transistors, the resonant circuits are such that, if their gate oscillates at a frequency $f_o$, the current on their source or drain output electrode oscillates at a frequency $2f_o$.

One known example of a doubler oscillator is illustrated in FIG. 1 and is of the so-called "push-push" type. Two field-effect transistors 1 and 2 operate in parallel and are caused to oscillate in phase opposition. To this end, two parallel microstrips 3 and 4 are each connected to the gate of one transistor. A reactance is connected to each source and the total energy is collected on an impedance transformer which is connected to the drains. This arrangement as well as biasing of the transistors falls into the general category of practical knowledge already acquired in the prior art.

A dielectric resonator 5 is positioned between the two microstrips 3 and 4. Since the gate circuits of each transistor are located on opposite sides of the dielectric resonator 5, the currents of each gate are coupled and exactly in opposite phase. Under these conditions, each transistor is phase-controlled in dependence on the other transistor and the second harmonic of their energy is in phase at the output of the oscillator, on the drains.

It has in fact been found, however, that practical difficulties are attached to the fabrication of the dielectric resonator. In the first place, it is known that dielectric resonators are small ceramic cylinders and have a diameter of the order of 1 mm at frequencies of the order of 20 GHz. This is a small size for machining but very large for the purpose of deposition and positioning on an integrated circuit chip. Secondly, resonators are resistive at several frequencies since a number of different modes are possible in a given cylindrical structure in addition to the fundamental mode. Hybrid modes and higher-order modes can therefore be excited by one and the same coupling structure. It is therefore necessary to design the oscillator circuit in such a manner as to prevent oscillation at undesired frequencies.

The voltage-controlled oscillator in accordance with the invention avoids the disadvantages attached to dielectric resonators and can be integrated on a chip of semiconductor material such as silicon or group-III-IV material such as GaAs, depending on the frequency. This oscillator is also of the "push-push" type.

In this oscillator, provision is made for two identical channels. In FIG. 2, the source of each of two field-effect transistors 6 and 7 is connected to an LC circuit composed of an inductor 8 and a capacitor 9 whilst their two drains are connected together to a load 11 through an inductor 10 and a capacitor 23. The capacitor 23 decouples the direct current from the microwave frequencies. The two transistors are supplied on their drains from a voltage $+V_{DD}$ via an inductor 12 together with a decoupling capacitor 13.

The originality of the circuit arises from the fact that the phase opposition at the fundamental frequency between the two gates of the two transistors is obtained by means of a varactor, each access terminal of which is connected to the gate of a transistor.

A varactor is a pn junction or reverse-biased Schottky diode. Depending on the voltage applied to its terminals, this device is accordingly designed as a variable capacitor in series with a resistor having a low value of resistance. A varactor is therefore a reverse-biased diode. The best varactors at present available are the hyper-abrupt GaAs varactors.

A varactor 14 is therefore connected between the gates of the two transistors 6 and 7. However, each access terminal of the varactor is connected to one gate through a capacitor 15 or 16 in such a manner as to ensure that the gate considered is decoupled in direct current. The varactor 14 in fact requires a bias voltage which is directly applied to its terminals between the external access terminals 17 and 18. This voltage is filtered by the inductors 19 and 21 and the decoupling capacitors 20 and 22.

In a varactor-tunable oscillator, the electronic tuning band is limited in the first place by the variation in susceptance of the circuits associated with the transistors. In the oscillator according to the invention, there is no self-inductance in parallel with the transistor terminals and, in this case, the range of frequencies of the VCO is given by:

$$\omega_{max}/\omega_{min} = \sqrt{C_{max}/C_{min}}$$

it being known that the frequency f is related to the angular frequency by $\omega = 2\pi f$, and $C_{max}$ and $C_{min}$ are the extreme values of the varactor 14. In practice, there always exists a low self-inductance which is due to connections and has the effect of reducing the negative-conductance bandwidth. Thus the varactor 14 increases the range of negative resistance and modifies the impedance of the gate circuits.

One of the problems presented by varactors is that they make it necessary to supply the bias voltage directly to their terminals and the effect of this bias voltage is to produce additional parasitic reactances. In order to obtain a higher tuning band, another tuning varactor can be placed in the source circuit in the case of each transistor of the VCO.

It is this alternative arrangement which is illustrated in FIG. 3. The circuit of the gates of transistors 6 and 7 is identical with that of the previous figure and includes a first varactor 14. However, two additional varactors 24 and 25 are mounted in the source circuit of the transistors 6 and 7, the varactor 24 being mounted in the circuit of transistor 6 and the varactor 25 being mounted in the circuit of transistor 7. Each of these varactors is introduced between the inductor 8 and the capacitor 9 for decoupling the source circuit.

In accordance with the technique which is known to those versed in the art, the second and third varactors 24 and 25 are reverse-biased by a voltage between the terminals 26 and ground in the case of the varactor 24 and by a voltage between the terminals 27 and ground in the case of the varactor 25. The supply voltages of the varactors 24 and 25 are in turn filtered.

The varactors mounted in the source circuits modify the source impedance and increase the range of negative resistance. Thus the tuning bandwidth of the VCO is larger since it is a function of the capacitances of the varactors and of the source capacitances.

Furthermore, since the two transistors operate in phase opposition, the FM noise level around the carrier is lower. Thus in the case of a VCO having only one gate-circuit varactor 14, an FM noise level of −75 dBc/Hz has been measured at 10 kHz from the carrier whilst the estimated value at 100 kHz from the carrier at 5.5 GHz (fundamental mode at 2.75 GHz) is −105 dBc/Hz. It has only been possible to estimate the FM noise level at 100 kHz since it is sufficiently low to be masked by the FM noise of the spectrum analyzer.

The foregoing description is based on the assumption that the voltage-controlled oscillator employs field-effect transistors but the structure of the VCO is readily adaptable to bipolar transistors, depending on the frequency.

This structure permits monolithic integration since the varactors are diodes which can be integrated in the same manner as transistors, inductors and capacitors, especially at microwave frequencies.

The voltage-controlled oscillator in accordance with the invention is employed in data-processing systems or as a local oscillator for radar systems and telecommunications.

Having thus described the invention and its mode of operation, the features which are believed novel are defined in the appended claims.

What is claimed is:

1. A frequency-doubling voltage-controlled oscillator having two transistors operating in parallel in which the currents collected on one of the access electrodes (source or drain) of said two transistors are in phase opposition in order to reduce frequency-modulation noise in the vicinity of the fundamental frequency of the oscillator, wherein said oscillator has a single circuit for the two gates of the two transistors, said single circuit being constituted by a varactor, each access terminal of said varactor being respectively connected to one gate of each of said two transistors.

2. An oscillator according to claim 1, wherein a capacitor is mounted between each access terminal of the varactor and each gate of the two transistors in order to decouple the gates in direct current.

3. An oscillator according to claim 2, wherein the varactor is reverse-biased in direct current by an external voltage applied between a first terminal connected to one side of said varactor and a second terminal connected to a second side of said varactor, said bias voltage being decoupled by a first capacitor and a second capacitor from each transistor gate respectively.

4. An oscillator according to claim 1, wherein energy is collected from the drain of each transistor though an inductor, the drain currents of the two transistors being coupled and applied to a load.

5. An oscillator according to claim 1, wherein said oscillator is provided in addition with a second and a third varactor mounted in the source circuits of the two transistors, each of said second and third varactors being mounted between an inductor and a decoupling capacitor of a gate circuit of each of said transistors.

6. An oscillator according to claim 5, wherein the second and third varactors are each reverse-biased in direct current by an external voltage supply between a first and second terminal which are each common to one of said second and third varactors and to a combination of a decoupling capacitor and ground.

* * * * *